(12) United States Patent
Yu et al.

(10) Patent No.: US 11,335,767 B2
(45) Date of Patent: May 17, 2022

(54) PACKAGE STRUCTURE AND METHOD OF FABRICATING THE SAME

(71) Applicant: Taiwan Semiconductor Manufacturing Co., Ltd., Hsinchu (TW)

(72) Inventors: Chen-Hua Yu, Hsinchu (TW);
Chuei-Tang Wang, Taichung (TW);
Tzu-Chun Tang, Kaohsiung (TW);
Wei-Ting Chen, Tainan (TW);
Chieh-Yen Chen, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 65 days.

(21) Appl. No.: 15/710,847

(22) Filed: Sep. 21, 2017

(65) Prior Publication Data

US 2019/0035877 A1 Jan. 31, 2019

Related U.S. Application Data

(60) Provisional application No. 62/538,819, filed on Jul. 31, 2017.

(51) Int. Cl.
| | |
|---|---|
| *H01L 49/02* | (2006.01) |
| *H01L 23/522* | (2006.01) |
| *H01L 25/00* | (2006.01) |
| *H01L 23/28* | (2006.01) |
| *H01L 23/00* | (2006.01) |

(Continued)

(52) U.S. Cl.
CPC ............ *H01L 28/10* (2013.01); *H01L 21/568* (2013.01); *H01L 21/6835* (2013.01); *H01L 23/28* (2013.01); *H01L 23/5226* (2013.01); *H01L 23/5227* (2013.01); *H01L 23/645* (2013.01); *H01L 24/19* (2013.01); *H01L 24/20* (2013.01); *H01L 25/50* (2013.01); *H01L 21/486* (2013.01); *H01L 23/49816* (2013.01); *H01L 23/5384* (2013.01); *H01L 23/5389* (2013.01); *H01L 24/32* (2013.01); *H01L 24/73* (2013.01); *H01L 24/92* (2013.01); *H01L 24/97* (2013.01); *H01L 2221/68345* (2013.01); *H01L 2221/68359* (2013.01); *H01L 2221/68368* (2013.01); *H01L 2224/04105* (2013.01); *H01L 2224/12105* (2013.01); *H01L 2224/32225* (2013.01); *H01L 2224/73267* (2013.01); *H01L 2224/92244* (2013.01); *H01L 2224/97* (2013.01); *H01L 2225/06544* (2013.01); *H01L 2225/06548* (2013.01); *H01L 2924/141* (2013.01); *H01L 2924/143* (2013.01); *H01L 2924/1421* (2013.01); *H01L 2924/1427* (2013.01); *H01L 2924/1431* (2013.01);
(Continued)

(58) Field of Classification Search
CPC .............................. H01L 23/5226; H01L 24/20
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Sarah K Salerno
(74) *Attorney, Agent, or Firm* — JCIPRNET

(57) ABSTRACT

A package structure has a chip, a molding compound encapsulating the chip and an inductor structure disposed above the chip. A vertical projection of the inductor structure at least partially overlaps with a vertical projection of the chip.

20 Claims, 21 Drawing Sheets

(51) Int. Cl.
  *H01L 21/56* (2006.01)
  *H01L 21/683* (2006.01)
  *H01L 23/64* (2006.01)
  *H01L 21/48* (2006.01)
  *H01L 23/538* (2006.01)
  *H01L 23/498* (2006.01)

(52) U.S. Cl.
  CPC ............... *H01L 2924/1433* (2013.01); *H01L 2924/1434* (2013.01); *H01L 2924/19042* (2013.01)

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,870,929 B2 * | 1/2018 | Hwang | H01L 24/17 |
| 2006/0088971 A1 * | 4/2006 | Crawford | H05K 1/165 438/381 |
| 2007/0257761 A1 * | 11/2007 | Mano | H01F 41/046 336/200 |
| 2010/0078760 A1 * | 4/2010 | Tang | H01L 23/5389 257/531 |
| 2010/0295151 A1 * | 11/2010 | Kurokawa | H01L 21/76898 257/531 |
| 2010/0314714 A1 * | 12/2010 | Nakamura | H01L 21/76898 257/531 |
| 2011/0149519 A1 * | 6/2011 | Choudhury | H05K 1/0236 361/707 |
| 2011/0285215 A1 * | 11/2011 | Hatase | H01F 27/2871 307/104 |
| 2013/0056847 A1 * | 3/2013 | Chen | H01F 27/24 257/531 |
| 2014/0312458 A1 * | 10/2014 | Ashrafzadeh | H01L 23/3121 257/531 |
| 2017/0062120 A1 * | 3/2017 | Yun | H05K 1/165 |
| 2018/0026666 A1 * | 1/2018 | Yun | H04B 1/1638 455/188.1 |
| 2018/0033725 A1 * | 2/2018 | Liang | H01L 23/3157 |
| 2018/0040547 A1 * | 2/2018 | Zuo | H01L 23/49827 |
| 2018/0269708 A1 * | 9/2018 | Yeh | H01F 27/2804 |

* cited by examiner

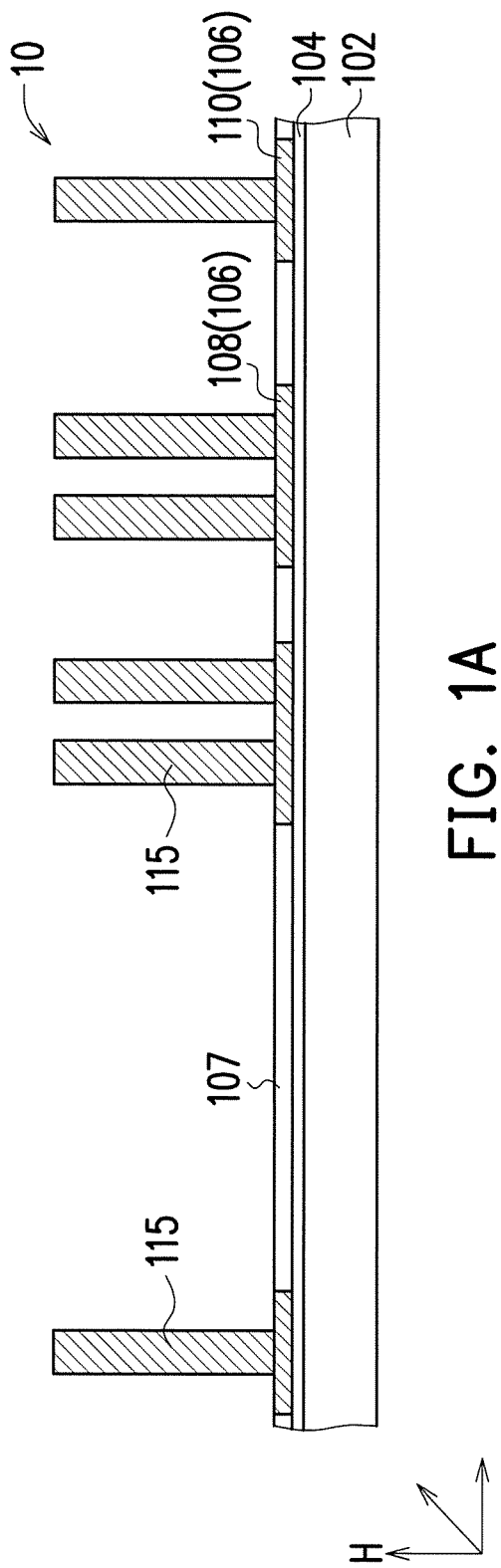
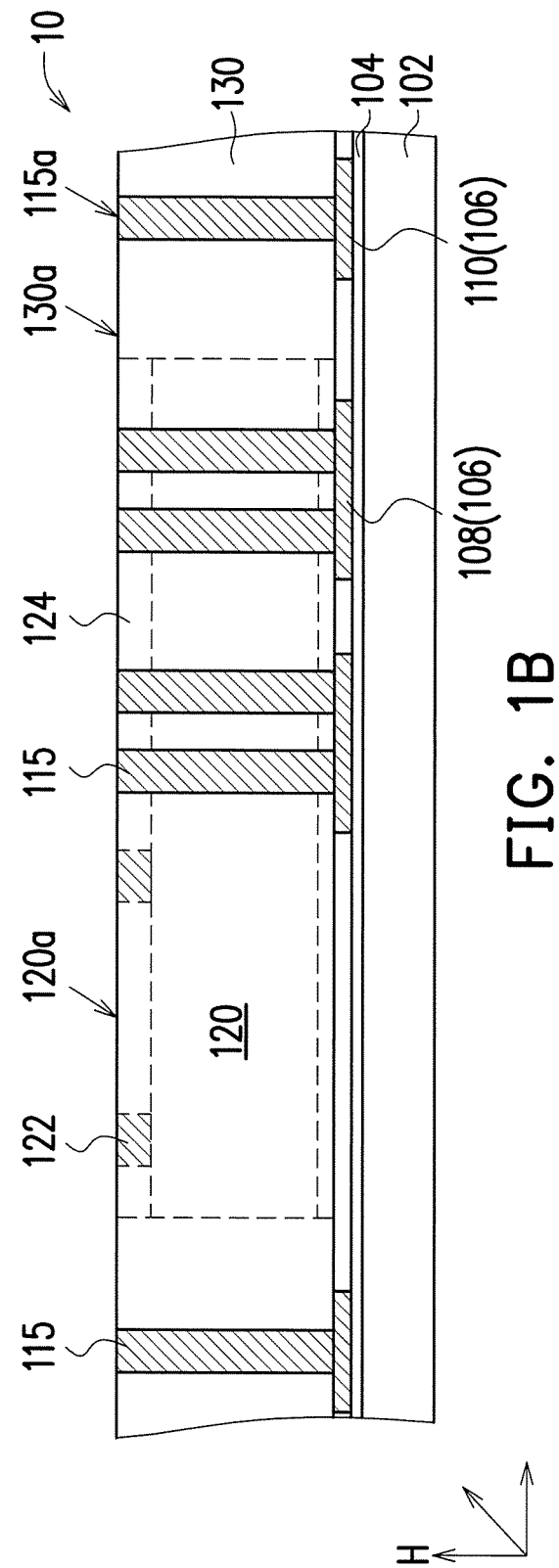
FIG. 1A
FIG. 1B

PACKAGE STRUCTURE AND METHOD OF FABRICATING THE SAME

CROSS-REFERENCE TO RELATED APPLICATION

This application claims the priority benefit of U.S. provisional application Ser. No. 62/538,819, filed on Jul. 31, 2017. The entirety of the above-mentioned patent application is hereby incorporated by reference herein and made a part of this specification.

BACKGROUND

As the demand for shrinking electronic devices is high, it is important to develop packaging techniques suitable for packaging and integrating smaller and more compact electronic devices and/or semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1E are the schematic side views showing the package structure at various stages of the method of fabricating a package structure according to some embodiments of the present disclosure.

DETAILED DESCRIPTION

Figure 1C:
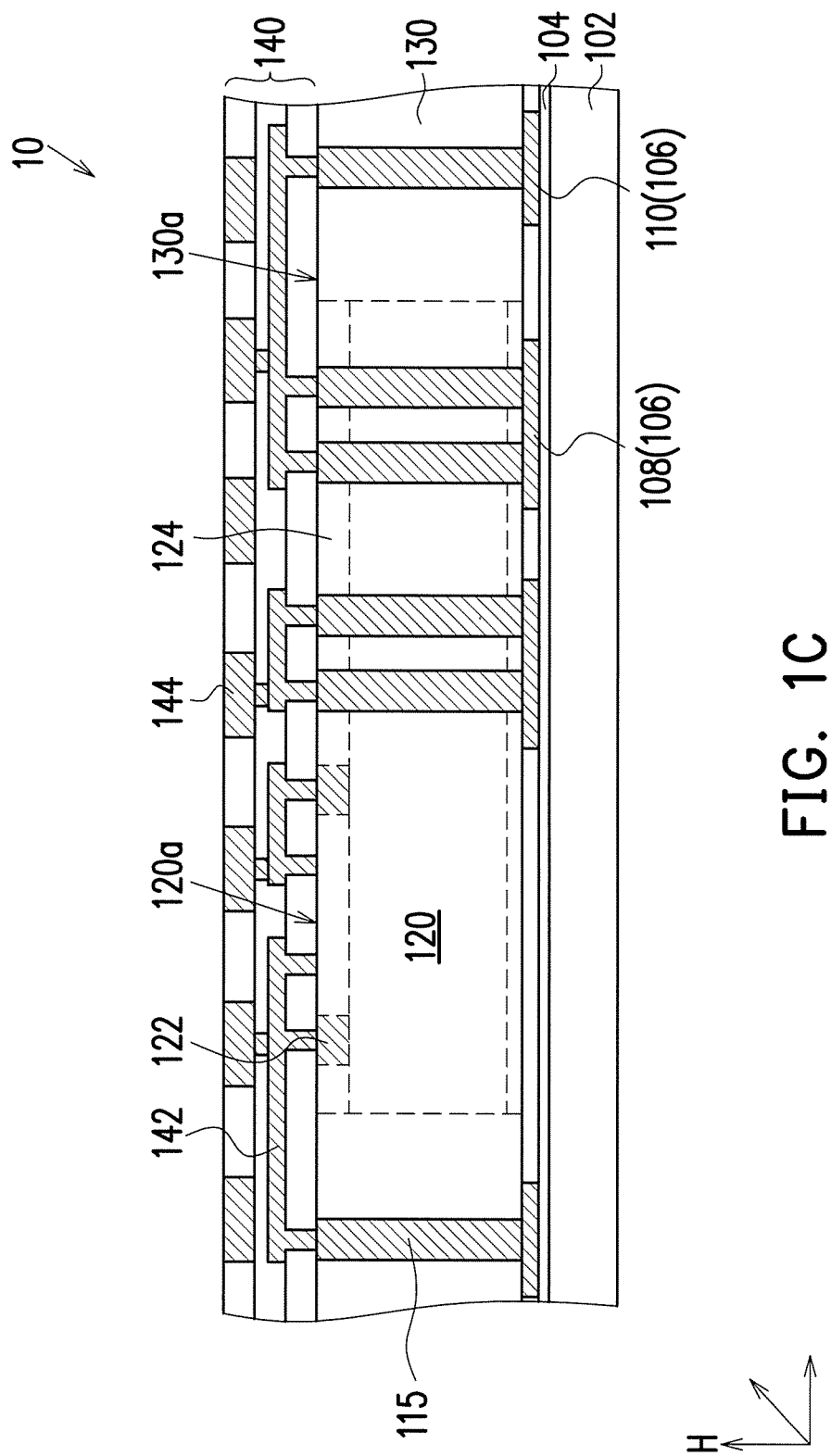

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1E are the schematic side views showing a cross-section of the package structure at various stages of the method of fabricating a package structure according to some embodiments of the present disclosure. It is to be noted that the process steps described herein cover a portion of the manufacturing processes used to fabricate a package structure. The embodiments are intended to provide further explanations but are not used to limit the scope of the present disclosure.

In accordance with some embodiments, as shown in FIG. 1A, a carrier 102 is provided. In some embodiments, the carrier 102 may be a glass carrier or any suitable carrier for the manufacturing method of the package structure. In some embodiments, the carrier 102 is provided with a material layer 104 formed thereon. In some embodiments, the material layer 104 may include a temporary bonding layer suitable for bonding/debonding the carrier 102 from the above layers disposed thereon. In some embodiments, the material layer 104 may include a release layer (such as a light-to-heat conversion ("LTHC") layer) and an adhesive layer (such as a ultra-violet curable adhesive or a heat curable adhesive layer). Referring to FIG. 1A, in some embodiments, the material layer 104 includes a dielectric material layer made of polyimide, benzocyclobutene ("BCB"), polybenzooxazole ("PBO"), or any other suitable polymer-based dielectric material. In certain embodiments, a conductive pattern 106 is formed on the material layer 104 and over the carrier 102. In certain embodiments, a cover layer 107 is formed on the material layer 104 but exposes the conductive pattern 106. In some embodiment, the conductive pattern 106 includes a plurality of conductive land patterns 108. In some embodiments, the conductive pattern 106 may further includes routing lines and pads 110. In certain embodiments, the conductive land patterns 108 includes land grid array pads. In some embodiments, the material of the conductive land patterns 108 may include copper, copper alloys, nickel, tungsten or other suitable metal materials.

In FIG. 1A, through interlayer vias ("TIVs") 115 are formed on the conductive land patterns 108 of the conductive pattern 106 over the carrier 102. In certain embodiments, except for the TIVs 115 formed on the conductive land patterns 108, some TIVs 115 are formed on the routing lines and pads 110. In some embodiments, the TIVs 115 are formed on and physically connected to the conductive land patterns 108. In some embodiments, the formation of the TIVs 115 includes forming a mask pattern (not shown) with openings, then forming a metallic material (not shown) filling up the openings by electroplating or deposition, and removing the mask pattern to form the TIVs 115. In some embodiments, the material of the TIVs 115 may include copper, copper alloys, nickel, tungsten or other suitable metal materials. However, it is appreciated that the scope of this disclosure is not limited to the materials and descriptions disclosed above.

In FIG. 1B, at least one chip/die 120 is provided and a molding compound 130 is formed over the carrier 102. Herein in FIG. 1B, although the chip or die shall be covered by the molding compound, for illustration purposes, the chip or die is shown to be seen from the side of the molding compound and is depicted in dotted lines. In FIG. 1B, only one chip or die is presented for illustrative purposes, however, it should be noted that one or more chips or dies may be provided. In some embodiments, the chip 120 has a passivation layer 124 and a plurality of pads 122 formed thereon. In one embodiment, the passivation layer 124 covers the active surface 120a of the chip 120 but exposing the conductive pads 122 for further electrical connections. In one embodiment, a die attach film may be provided between the chip 120 and the cover layer 107. In some embodiments, the chip 120 includes at least one power chip or voltage regulating chip. In some embodiments, the chip 120 may further include a wireless and radio frequency (RF) chip, a digital chip, an analog chip, a mixed signal chip, an application-specific integrated circuit ("ASIC") chip, a sensor chip, a memory chip or a logic chip. In certain embodiments the chip 120 further includes additional device(s) or chip(s) of the same type or different types. In alternative embodiments, plural chips 120 are provided. As shown in FIG. 1B, in some embodiments, the TIVs 115 are arranged beside the chip 120 and surrounding the chip 120. In some embodiments, the TIVs 115 are through integrated fan-out ("InFO") vias.

As shown in FIG. 1B, in some embodiments, the molding compound 130 is formed on the cover layer 107 and the conductive pattern 106 over the carrier 102. In FIG. 1B, the molding compound 130 is seen as transparent for illustration purposes to show the relative locations of the chip 120 and the TIVs 115, but the molding compound is not limited to be transparent. In some embodiments, the molding compound 130 covers the cover layer 107 and the conductive pattern 106 and fills between the TIVs 115 and the chip 120. In certain embodiments, the first molding compound 130 substantially encapsulates the chip 120 and the TIVs 115 but the top surfaces 115a of the TIVs 115 are exposed. In some embodiments, the conductive pads 122 of the chip 120 are exposed. In some embodiments, the formed first molding compound 130 completely encapsulates the TIVs 115 and then a planarization process is performed to partially remove the first molding compound 130 to expose the top surfaces 115a of the TIVs 115. That is, the surface 130a of the first molding compound 130 is coplanar and flush with the top surfaces 115a of the TIVs 115.

Referring to FIG. 1C, in some embodiments, a redistribution layer 140 is formed on the molding compound 130 and on the TIVs 115. In some embodiment, the formation of the redistribution layer 140 comprises sequentially forming one or more polymer dielectric material layers and one or more metallization layers in alternation. In some embodiments, the material of the metallization layer(s) includes aluminum, titanium, copper, nickel, tungsten, and/or alloys thereof. In some embodiments, the material of the polymer dielectric material layer(s) includes polyimide, benzocyclobutene, polybenzooxazole, or any other suitable polymer-based dielectric material. In some embodiments, the redistribution layer 140 functions as a front-side redistribution layer. In some embodiments, the redistribution layer 140 includes at least a bottom metallization layer 142 physically and electrically connected to the conductive pads 122 of the chip 120 and the TIVs 115, and an under bump metal (UBM) layer 144 for assisting ball mounting. In some embodiments, the materials of the UBM layer 144 include copper, nickel, aluminum, tungsten or alloys thereof. In certain embodiments, the redistribution layer 140 extends beyond the span of the chip and may be considered as a fan-out redistribution structure. However, it should be noted that the redistribution layer 140 is not limited to include two dielectric layers and/or two metallization layers.

Figure 1D:
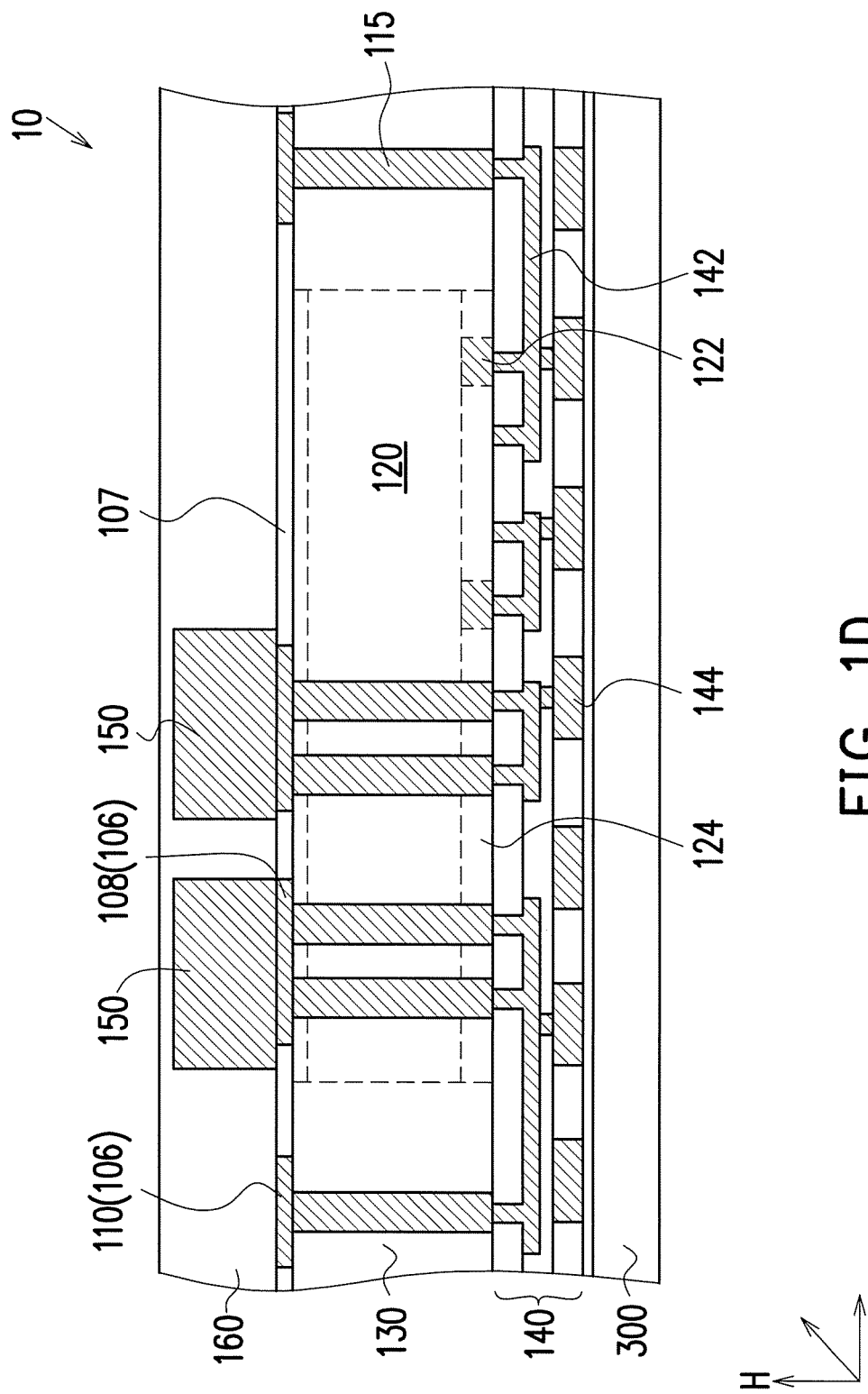

In FIG. 1D, in some embodiments, the wafer package structure 10 (FIG. 1C) is flipped (turned upside down) and the carrier 102 (FIG. 1C) is detached and removed. In some embodiments, the flipped wafer package structure 10 is placed on a carrier 300, with the redistribution layer 104 facing downward and the conductive pattern 106 facing upward in FIG. 1D. In some embodiments, an inductor pattern 150 is formed on the conductive land patterns 108 and on the cover layer 107. In some embodiments, the inductor pattern 150 is connected to the conductive land patterns 108 and is electrically connected with the TIVs 115 connected to the conductive land patterns 108. In certain embodiments, the inductor pattern 150 is formed by printing or the inductor pattern 150 is pre-formed and placed by lamination. In some embodiments, the inductor pattern 150 is formed by printing copper paste in patterns. In some embodiments, the inductor pattern 150 are pre-formed metal pad patterns and then placed on the conductive land patterns 108, on the cover layer 107 and above the chip 120 as shown in FIG. 1D. In some embodiments, an optional protection layer 160 may be formed over the inductor pattern 150 for protection.

Figure 1E:
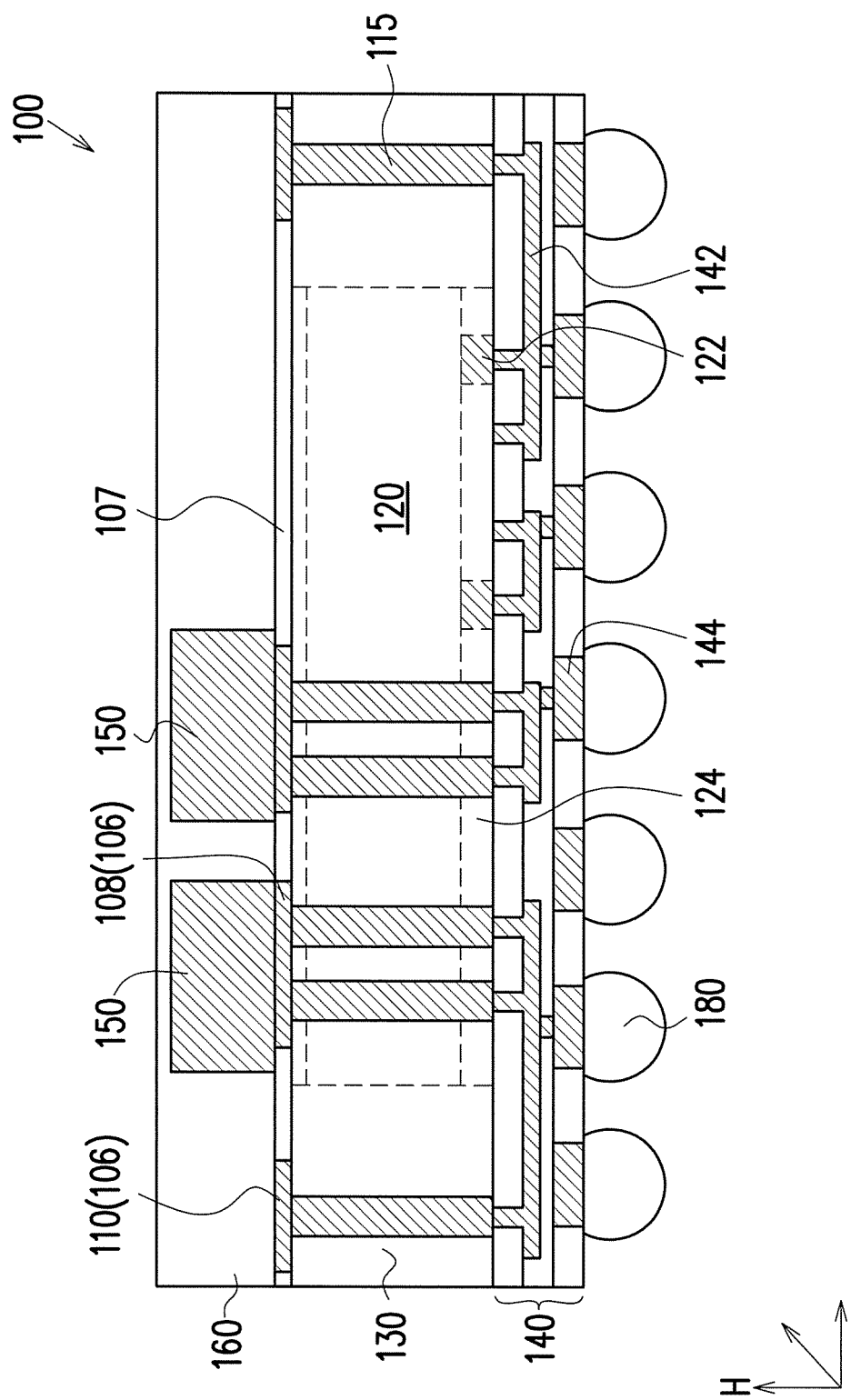

Referring to FIG. 1E, after the carrier 300 (FIG. 1D) is detached and removed, solder balls 180 are mounted on the under bump metal (UBM) layer 144 of the redistribution layer 140. Afterwards, a wafer dicing process is performed to cut the wafer package structure 10 (FIG. 1D) into individual and separate package structures 100.

Figure 3A:
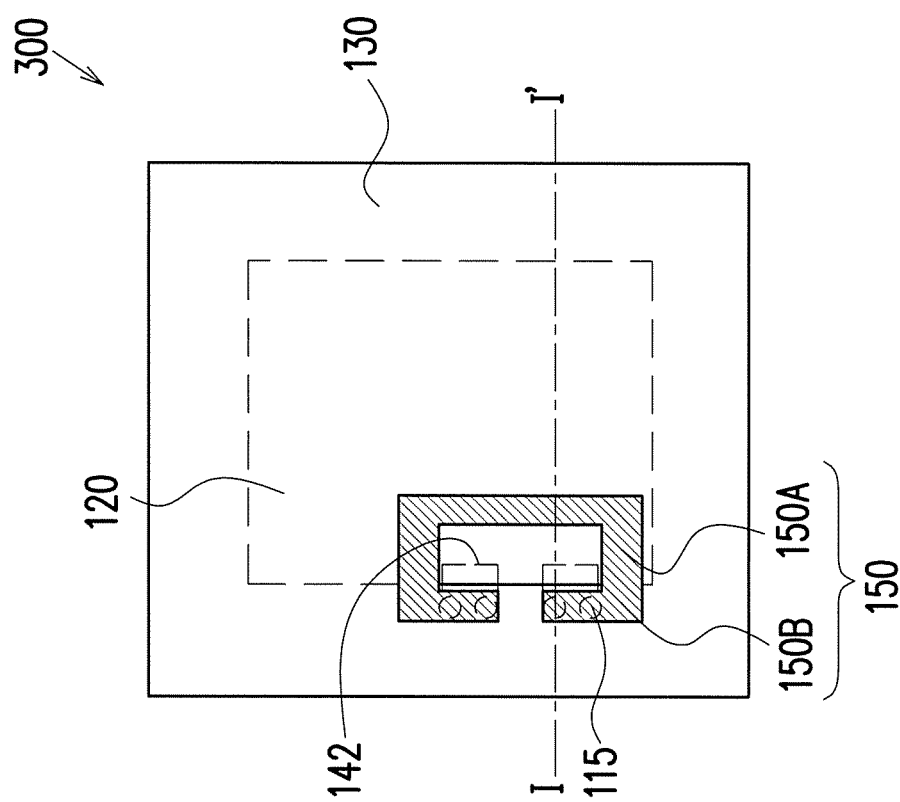
FIGS. 3A-3D are the schematic top and cross-sectional views showing various portions of a package structure according to some embodiments of the present disclosure.
Figure 3B:
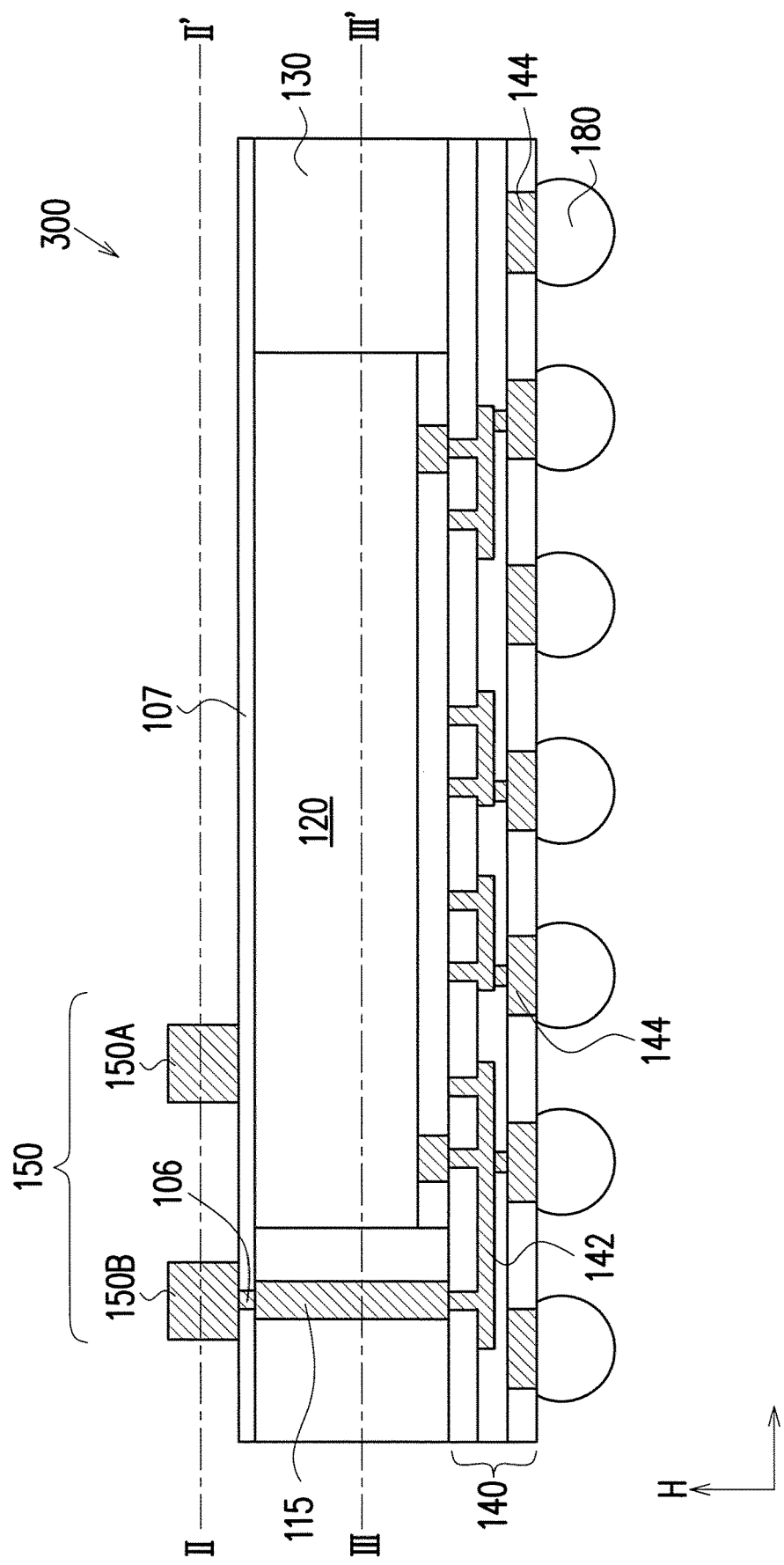
Figure 3C:
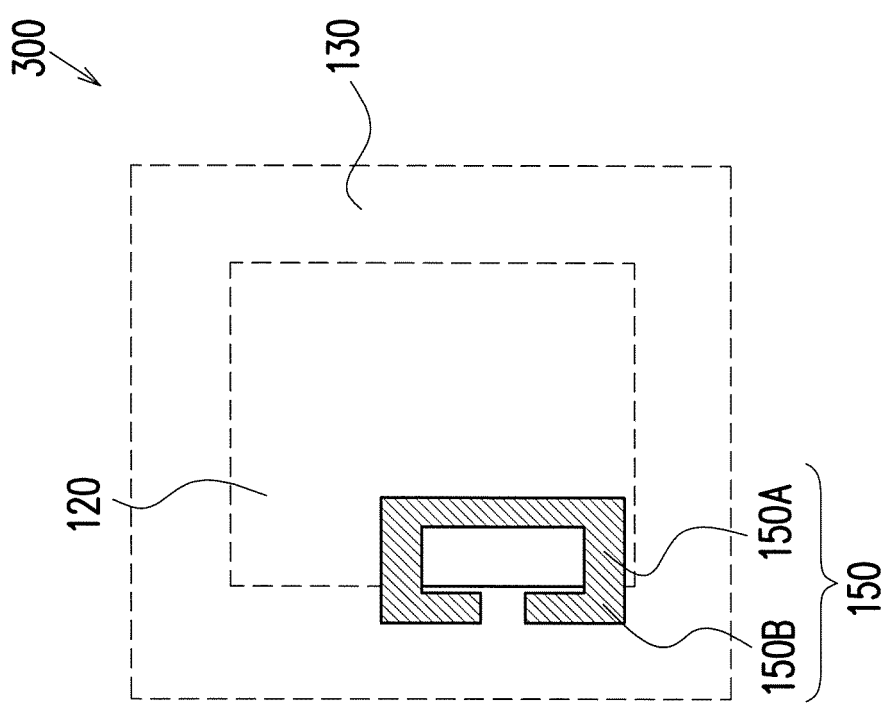
Figure 3D:
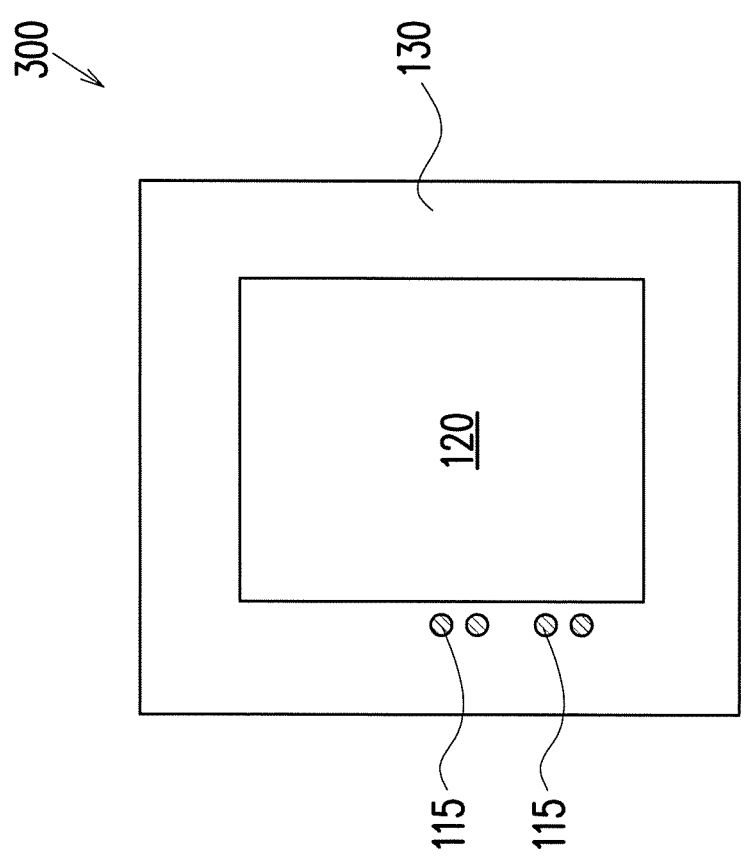

FIGS. 3A-3D are the schematic top and cross-sectional views showing various portions of a package structure according to some embodiments of the present disclosure. FIG. 3A shows the schematic top perspective view of an exemplary package structure 300. FIG. 3B shows the schematic cross-sectional view of FIG. 3A along the cross-sectional line I-I', and FIGS. 3C and 3D show the schematic top views of the cross-sections of the package structure of FIG. 3B along the cross-sectional lines II-II' and III-III'. Referring to FIGS. 3A-3C, the inductor pattern 150 is located above the chip 120. For illustration purposes, the protection layer 160 is omitted and the cover layer 107 may be seen as being transparent. In certain embodiments, a majority of the inductor pattern 150 is located directly above the chip 120 and the inductor pattern 150 is shaped as a planar split square ring. From the top view of In FIG. 3A, a vertical projection (the shaded area) of the inductor pattern 150 is partially overlapped with a vertical projection of the chip 120 (or the span of the chip 120, shown as the area circled by the dotted line). In certain embodiments, the inductor pattern 150 is formed by printing or plating. In some embodiments, the inductor pattern 150 is pre-formed and then placed by lamination. In some embodiments, the inductor pattern 150 functions as a horizontal inductor structure. From the top views of FIGS. 3A & 3C, the inductor pattern 150 includes a first portion 150A directly above the span of the chip 120 (illustrated in dotted line) and a second portion 150B located beside the chip 120. In some embodiments, the second portion 150B is located beside the chip 120 (not overlapped with the chip 120) and directly above the TIVs 115. In some embodiments, the TIVs 115 are connected with the second portion 150B through the routing lines and pads 110. In some embodiments, the first portion 150A is located directly above the chip 120 with the cover layer 107 in-between. From FIG. 3D, in some embodiments, the TIVs 115 are located beside the chip 120 and wrapped by the molding compound 130. In some embodiments, the TIV(s) 115 is physically and electrically connected with the bottom metallization layer 142 of the redistribution layer 140. In certain embodiments, the inductor pattern 150 is electrically connected to the redistribution layer 140 through the TIVs 115. In some embodiments, the inductor pattern 150 is further electrically connected to the chip 120 via the TIVs 115 and the redistribution layer 140. In some embodiment, some of the solder balls 180 are electrically connected with the chip 120 and some of the solder balls 180 are electrically connected with the inductor pattern 150. In some embodiments, the inductor pattern 150 functions as a horizontal inductor and the TIVs 115 connected to the inductor for further electrical connections. Although one inductor pattern is shown here as an example, two or more inductor patterns may be provided or arranged side by side as multiple inductors or coupled inductors.

Figure 2A:
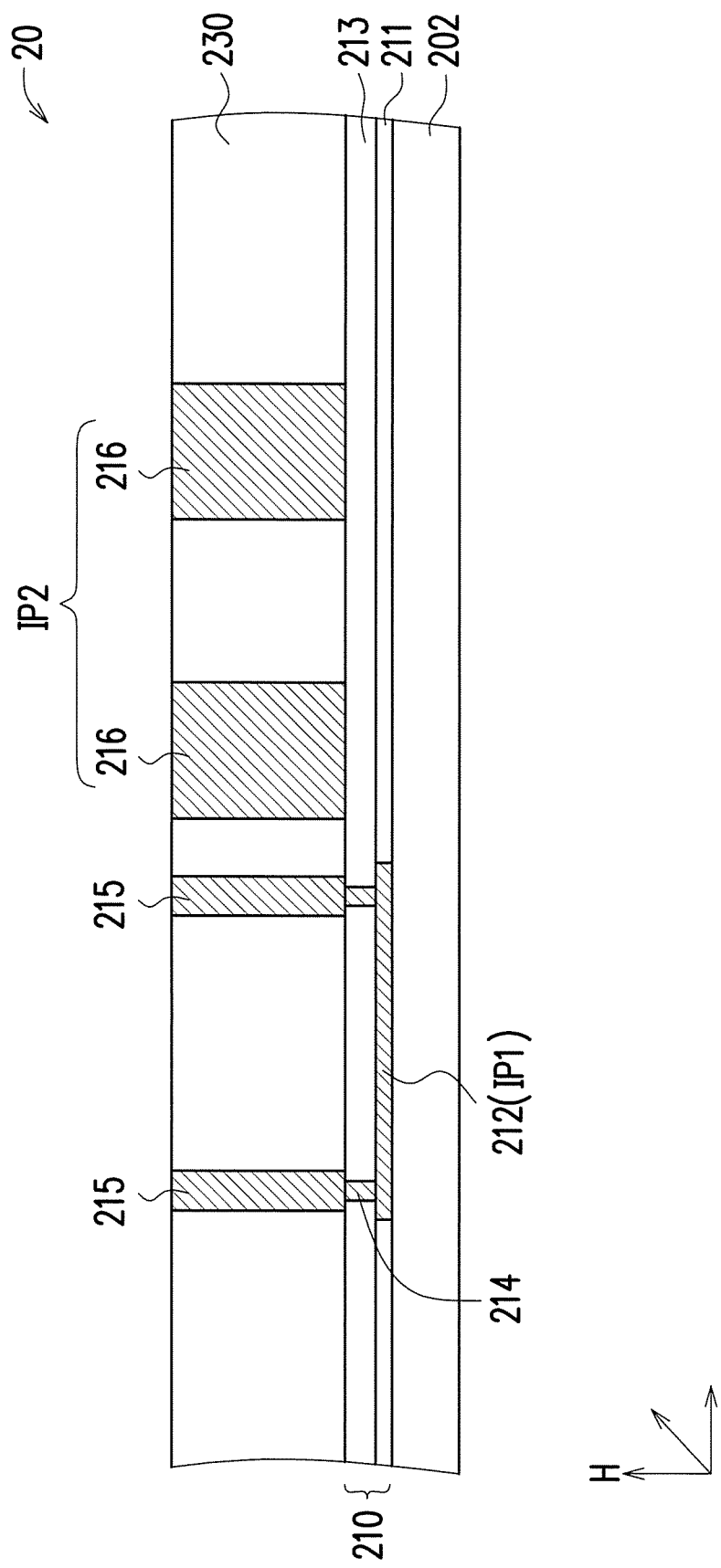
FIGS. 2A-2E are the schematic side views showing the package structure at various stages of the method of fabricating a package structure according to some embodiments of the present disclosure.

FIGS. 2A-2E are the schematic side views showing a cross-section of the package structure at various stages of the method of fabricating a package structure according to some embodiments of the present disclosure. In accordance with some embodiments, as shown in FIG. 2A, a carrier 202 is provided. In some embodiments, the carrier 202 may be a glass carrier or any suitable carrier for the manufacturing method of the package structure. In some embodiments, the carrier 202 may be provided with a material layer as described in the above embodiments, and for illustration purposes, such layer is omitted herein. Referring to FIG. 2A, in some embodiments, a redistribution layer 210 is formed on the carrier 202. In some embodiment, the formation of the redistribution layer 210 comprises forming a first dielectric layer 211, forming a first metallization pattern 212 on the carrier 202, forming a second dielectric layer 213 within openings and then forming a connection pattern 214 within the openings. The formation and materials of the redistribution layer 210 are similar to the aforementioned redistribution layer as described in the above embodiments and will not be repeated in details herein. In some embodiments, the first metallization pattern 212 includes a first inductor pattern IP1. In FIG. 2A, a plurality of through interlayer vias ("TIVs") 215 and a second metallization pattern 216 are formed on the redistribution layer 210. In FIG. 2A, the TIVs 215 are connected with the connection patterns 214 and are electrically connected to the first inductor pattern IP1. In some embodiments, the second metallization pattern 216 is formed on the second dielectric layer 213 of the redistribution layer 210, and located beside the TIVs 215. In some embodiments, the second metallization pattern 216 includes a second inductor pattern IP2. In some embodiments, the second inductor pattern IP2 functions as a horizontal inductor structure. In some embodiments, the location of the second metallization pattern 216 (or IP2) is not overlapped with the location of the below first inductor pattern IP1, and the TIVs 215 and the second metallization pattern 216 at the same layer are arranged side by side (not in contact with one another). In some embodiments, the TIVs 215 and the second metallization pattern 216 are formed at the same time during the same processes. That is, the second metallization pattern 216 may be considered as TIVs formed in different patterns or shapes. In some embodiments, the TIVs 215 may be wall shaped structures, and the first inductor pattern IP1 is a roof connected to the wall shaped structures (upside down). In some embodiments, the second inductor pattern IP2 of the second metallization pattern 216 may be ring shaped or open ring shaped (see FIG. 4D). In some embodiments, the TIVs 215 and the second metallization pattern 216 are formed by the same TIV formation process. In some embodiments, the formation of the TIVs 215 and the second metallization pattern 216 includes forming a mask pattern (not shown) with openings, then forming a metallic material (not shown) filling up the openings by electroplating or deposition, and removing the mask pattern to form the TIVs 215 and the second metallization pattern 216. In some embodiments, the material of the TIVs 215 and second metallization pattern 216 may include copper, copper alloys, nickel, tungsten or other suitable metal materials. However, it is appreciated that the scope of this disclosure is not limited to the materials and descriptions disclosed above.

Referring to FIG. 2A, a molding compound 230 is formed on the redistribution layer 210 and fills between the TIVs 215 and second metallization pattern 216. In some embodiments, the molding compound 230 covers at least the second dielectric layer 213 and substantially encapsulates the second metallization pattern 216 and the TIVs 215, with the top surfaces of the TIVs 215 and second metallization pattern 216 are exposed. In some embodiments, the formed molding compound 230 completely encapsulates the TIVs 215 and second metallization pattern 216 and then a planarization process is performed to partially remove the first molding compound 230.

Figure 2B:
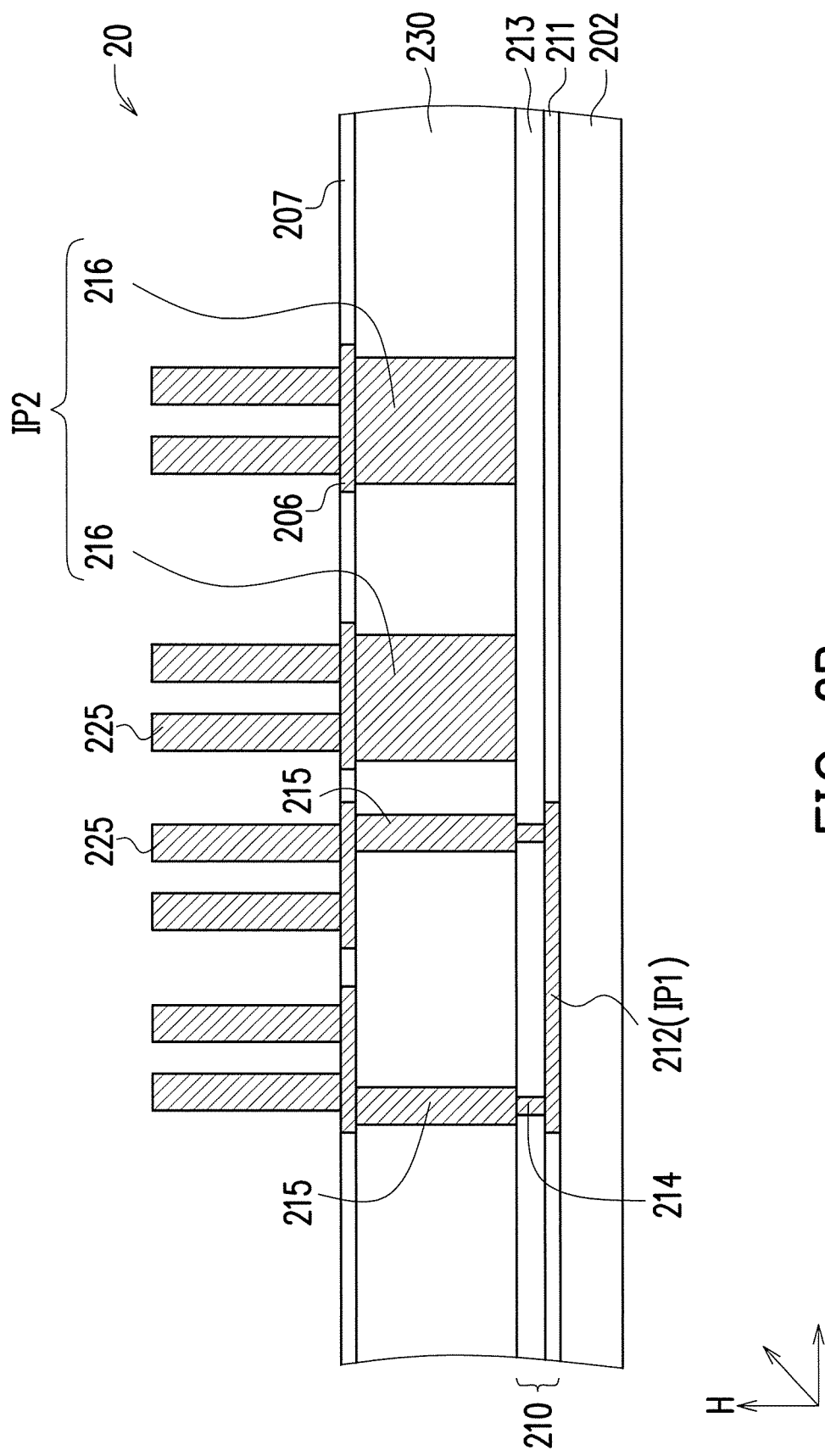

Referring to FIG. 2B, in some embodiments, a third dielectric layer 207 and a third metallization pattern 206 are formed on the first molding compound 230 and on the TIVs 215 and second metallization pattern 216. In some embodiments, the third dielectric layer 207 covers the molding compound 230 and the third metallization pattern 206 is formed in the openings of the third dielectric layer 207. In some embodiment, the third metallization pattern 206 includes a plurality of conductive land patterns. In some embodiments, the material of the third metallization pattern 206 may include copper, copper alloys, nickel, tungsten or other suitable metal materials. Referring to FIG. 2B, a plurality of TIVs 225 is formed on the third metallization pattern 206. In certain embodiments, the TIVs 225 are connected to the conductive land patterns of the third metallization pattern 206. The material and formation of the TIVs 225 are similar to the TIVs 215 and details will not be repeated herein.

Figure 2C:
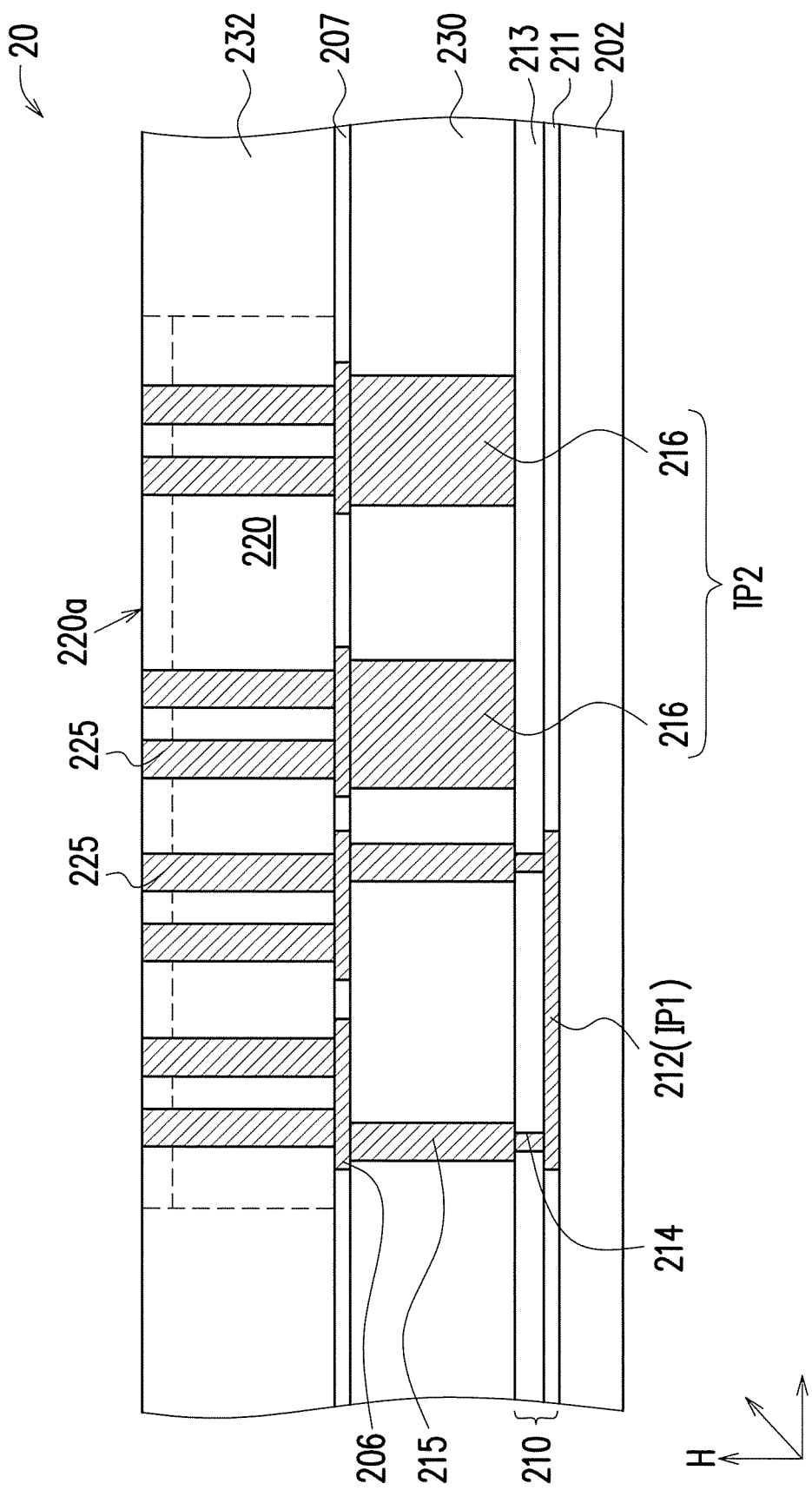

In FIG. 2C, at least one chip 220 is provided and a second molding compound 232 is formed over the first molding compound 230. Herein in FIG. 2C, although the chip or die shall be covered by the molding compound, for illustration purposes, the chip or die is shown to be seen from the side of the molding compound and is depicted in dotted lines. In FIG. 2C, only one chip or die is presented for illustrative purposes, however, it should be noted that one or more chips or dies may be provided. In some embodiments, the chip 220 is placed on the third dielectric layer 207 and the third metallization pattern 206. In FIG. 2C, the second molding compound 232 is seen as transparent for illustration purposes to show the relative locations of the chip 220 and the TIVs 225, but the molding compound is not limited to be transparent. In FIG. 2C, the active surface 220a of the chip 220 faces upward. In some embodiments, the second molding compound 232 is formed over the third dielectric layer 207 and the third metallization pattern 206, covering the third dielectric layer 207 and the third metallization pattern 206 and filling between the TIVs 225 and the chip 220. In certain embodiments, the second molding compound 232 substantially encapsulates the chip 220 and the TIVs 225 but the top surfaces of the TIVs 225 and the active surface 220a of the chip 220 are exposed. In some embodiments, the chip 220 includes at least one power chip or voltage regulating chip. In some embodiments, the chip 220 may further include at least one wireless and radio frequency (RF) chip, digital chip, analog chip, mixed signal chip, application-specific integrated circuit ("ASIC") chip, sensor chip, memory chip, or logic chip. As shown in FIG. 2C, in some embodiments, the TIVs 225 are arranged beside the chip 220 and surrounding the chip 220. In some embodiments, the TIVs 225 are through integrated fan-out ("InFO") vias.

Figure 2D:
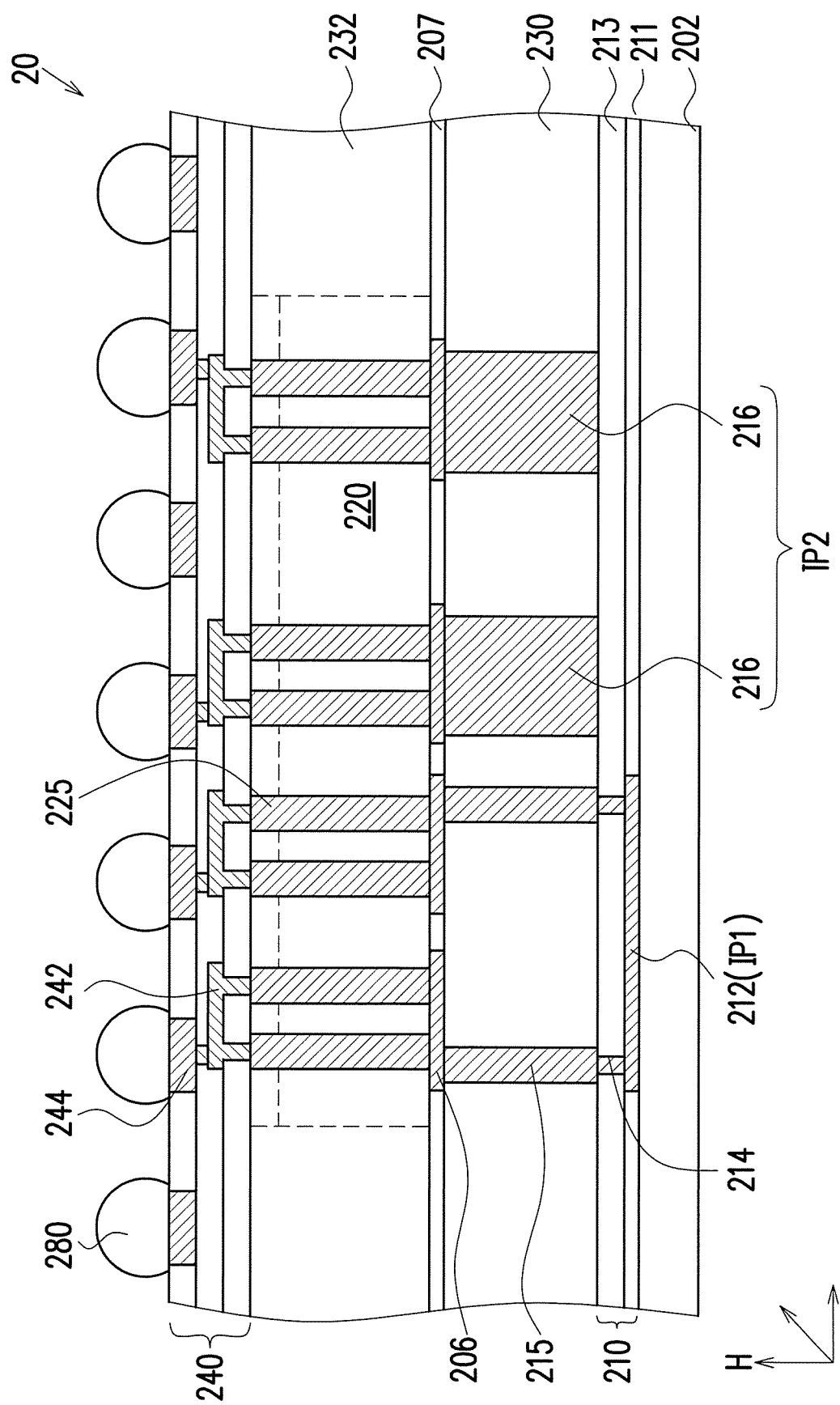

Referring to FIG. 2D, in some embodiments, a redistribution layer 240 is formed on the second molding compound 232 and on the TIVs 225. In some embodiment, the formation of the redistribution layer 240 comprises sequentially forming one or more polymer dielectric material layers and one or more metallization layers in alternation. In some embodiments, the material of the metallization layer(s) includes aluminum, titanium, copper, nickel, tungsten, and/or alloys thereof. In some embodiments, the material of the polymer dielectric material layer(s) includes polyimide, benzocyclobutene, polybenzooxazole, or any other suitable polymer-based dielectric material. In some embodiments, the redistribution layer 240 functions as a front-side redistribution layer and includes at least a bottom metallization layer 242 physically and electrically connected to the TIVs 225 and the chip 220, and an under bump metal (UBM) layer 244 for assisting ball mounting. In some embodiments, the materials of the UBM layer 244 include copper, nickel, aluminum, tungsten or alloys thereof. In certain embodiments, the redistribution layer 240 extends beyond the span of the chip and may be considered as a fan-out redistribution structure. However, it should be noted that the redistribution layer 240 is not limited to include two dielectric layers and/or two metallization layers.

In FIG. 2D, in some embodiments, solder balls 280 are mounted on the under bump metal (UBM) layer 244 of the redistribution layer 240.

Figure 2E:
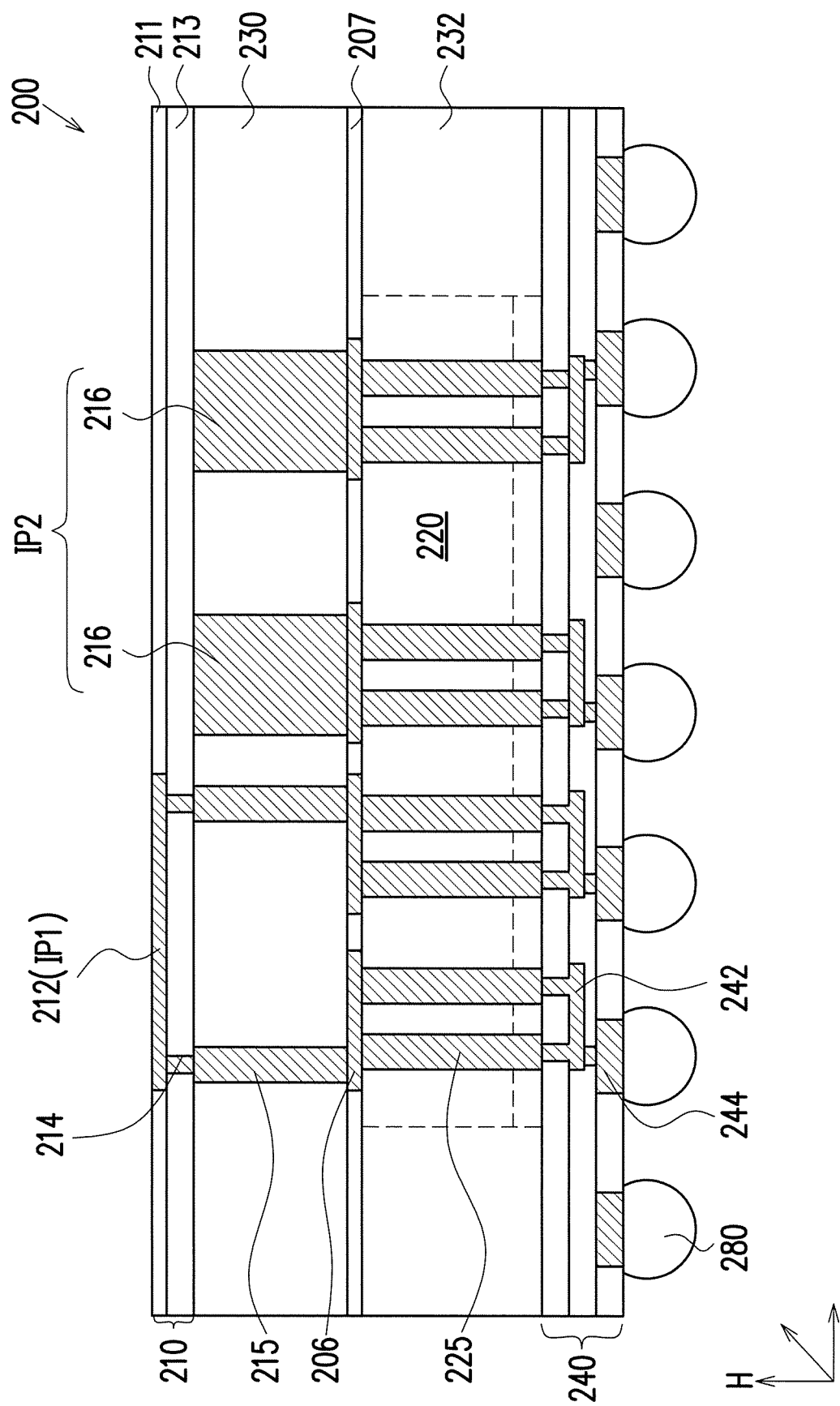

Referring to FIG. 2E, the wafer package structure 20 (FIG. 2D) is flipped (turned upside down) and the carrier 202 (FIG. 2D) is detached and removed. Then, in some embodiments, the flipped wafer package structure 20 may be placed on a carrier (not shown), with the solder balls 280 and the redistribution layer 240 facing downward and the first metallization pattern 212 facing upward in FIG. 2E. In some embodiments, a wafer dicing process is performed to cut the wafer package structure 20 (FIG. 2D) into individual and separate package structures 200.

Figure 4A:
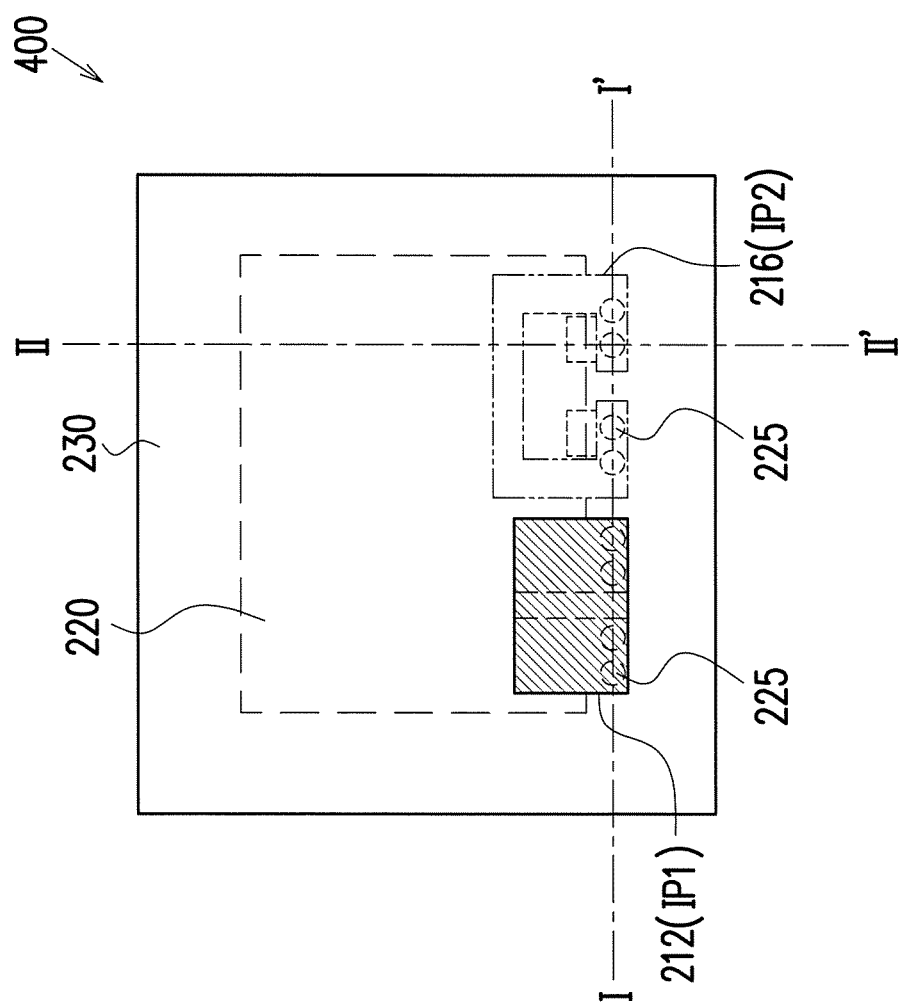
FIGS. 4A-4D are the schematic top and cross-sectional views showing various portions of a package structure according to some embodiments of the present disclosure.
Figure 4B:
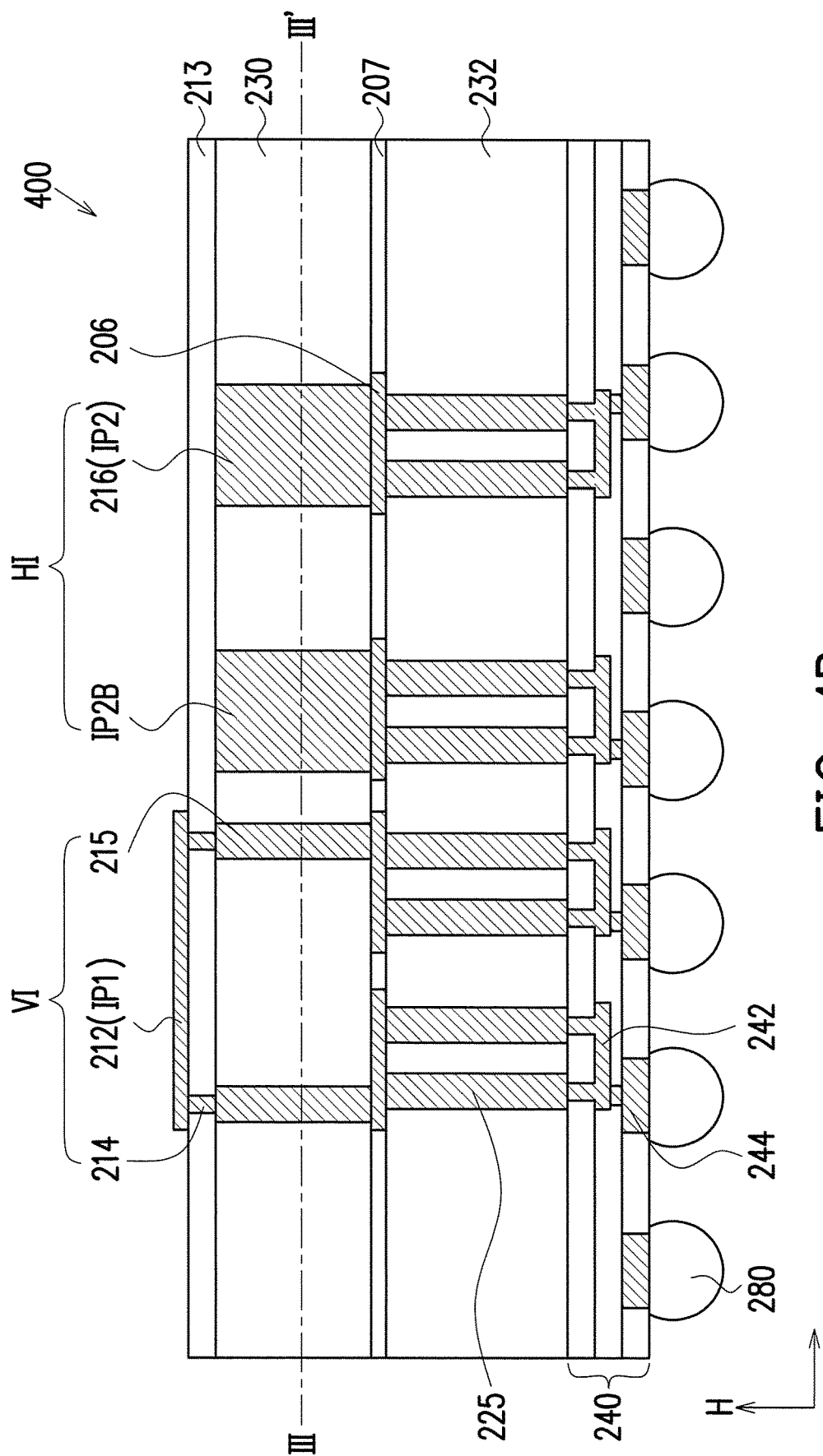
Figure 4C:
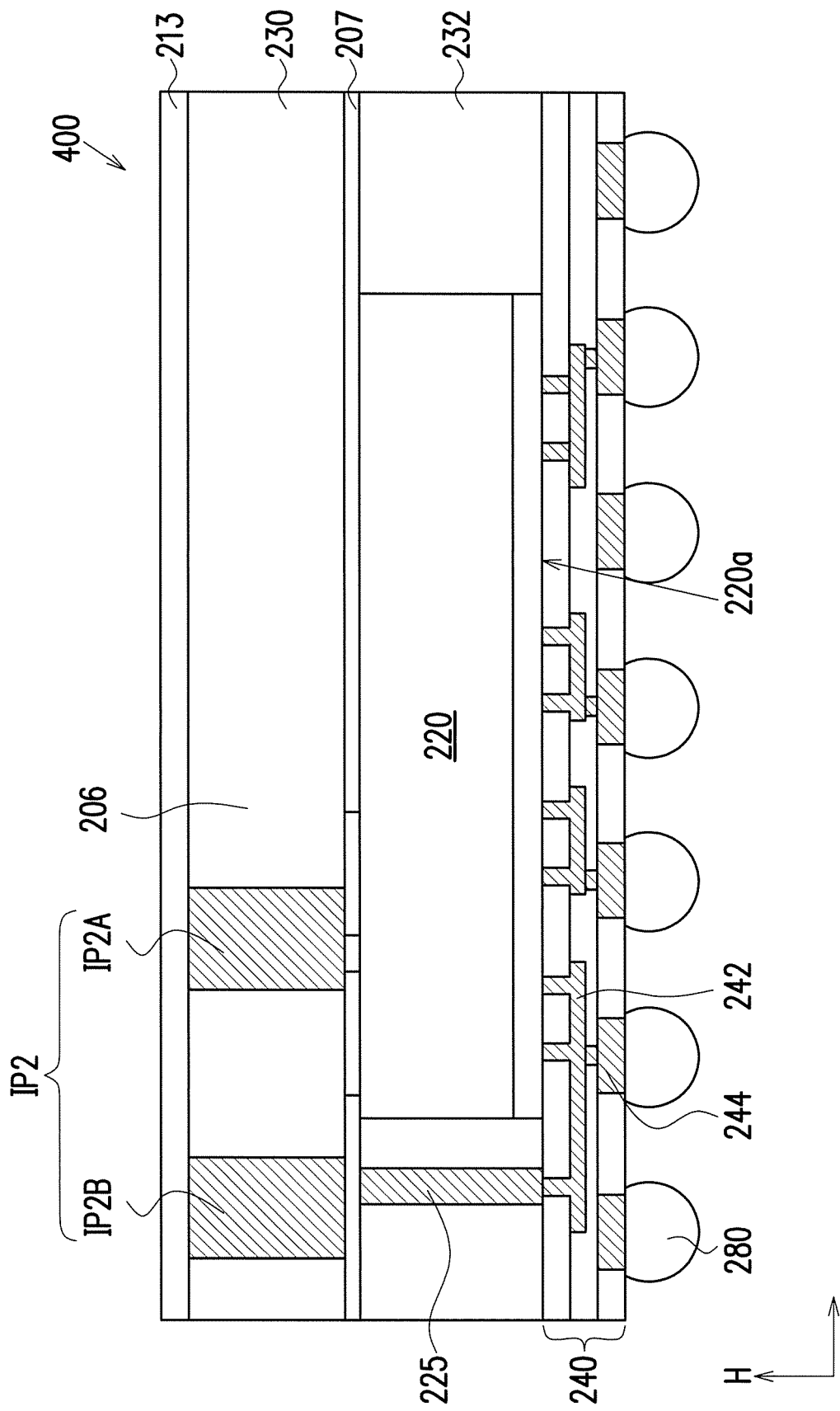
Figure 4D:
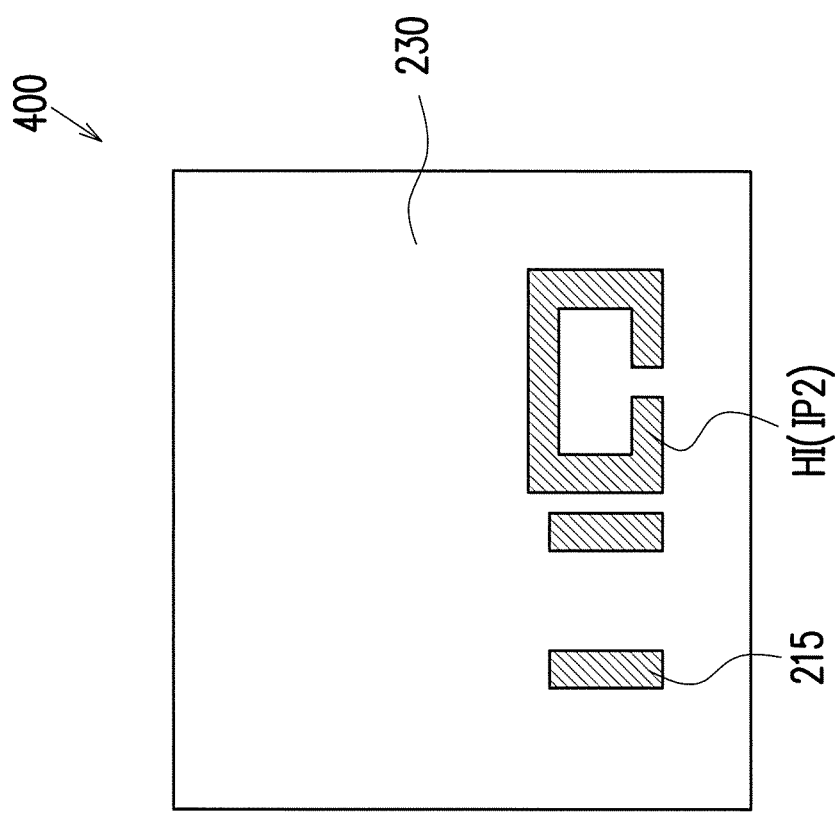

FIGS. 4A-4D are the schematic top and cross-sectional views showing various portions of a package structure according to some embodiments of the present disclosure. FIG. 4A shows the schematic top perspective view of an exemplary package structure 400. FIGS. 4B and 4C show the schematic cross-sectional views of FIG. 4A respectively along the cross-sectional lines I-I' and II-IF, and FIG. 4D shows the schematic top view of the cross-section of the package structure of FIG. 4B along the cross-sectional line III-III'. Referring to FIGS. 4A-4D, the inductor patterns IP1 and IP2 are both located above the chip 120, and the inductor pattern IP1 is located above the inductor pattern IP2. From the top view of In FIG. 4A, a vertical projection of the inductor pattern IP1 (the shaded area) is partially overlapped with a vertical projection of the chip 220 (or the span of the chip 220, shown as the area circled by the dotted line). Similarly, in FIG. 4A, a vertical projection of the inductor pattern IP2 (the area circled by the dash line) is partially overlapped with a vertical projection of the chip 220. For illustration purposes, certain dielectric layer of the redistribution layer may be seen as being transparent. In certain embodiments, the inductor pattern IP2, similar to the inductor pattern 150 of FIG. 3A, is shaped as a planar split square ring in FIG. 4D. From FIGS. 4A & 4C, the inductor pattern IP2 includes a first portion IP2A directly above the span of the chip 220 (illustrated in dotted lines) and a second portion IP2B located beside the chip 220. In some embodiments, the second portion IP2B is located beside the chip 220 (not overlapped with the chip 220) and directly above the TIVs 225. In some embodiments, as seen in FIG. 4B, the TIVs 225 are electrically connected with the inductor pattern IP2 through the metallization pattern 206. From FIGS. 4A-4C, the inductor pattern IP1 is located on the dielectric layer 213 and above the molding compound 230. In certain embodiments, the inductor pattern IP1 is shaped as a planar square block and is located mainly right above the span of the chip 220. In some embodiments, the inductor pattern IP1 is connected with the TIVs 215 through the connection pattern 214 and further connected with the TIVs 225 though the metallization pattern 206. From the top view of FIGS. 4A and 4D, in some embodiments, the TIVs 215 underneath the inductor pattern IP1 may be shaped as parallel square blocks (wall-shaped TIVs). In certain embodiments, the locations of the TIVs 215 (wall shaped TIVs) are aligned with the location of the inductor pattern IP1 and are located below and at two opposite short sides (of the rectangular top view) of the inductor pattern IP1. However, the arrangement and shapes of the TIVs 215 may be adjusted depending on the shape and design of the inductor pattern above. In some embodiments, the inductor pattern IP1, the TIVs 215 (wall-shaped TIVs) connected to the two short sides of the inductor pattern IP1 (like a roof) and the connection pattern 214 basically form a vertical inductor structure (VI), which is in a ring shape at the vertical cross-section (e.g. along line I-I') along the thickness direction H (i.e. the vertical direction) of the package structure 400. In some embodiments, the inductor pattern IP2 basically forms a horizontal inductor structure (HI), which is in an open ring shape from the cross sectional view (e.g. along line of the package structure 400. In some embodiments, these inductor structures VI, HI are electrically connected with the underlying TIVs 225 through the metallization pattern 206. In certain embodiments, these inductor structures VI, HI are electrically connected to the underlying chip 220 and/or solder balls 280 through the TIVs 225 and the redistribution layer 240. In some embodiments, these inductor structures VI, HI are arranged mainly above the span of the chip 220 with the connection structures (TIVs 225) arranged aside the chip 220 and along one or more sides of the chip 220.

In accordance with some embodiments in the present disclosure, compared with the area-consuming arrangement of the inductor(s) and/or passive component(s) arranged at the same level but around the packaged chip(s) or die(s), the inductor structures that are mainly arranged directly above the chip or die and integrated into the package structures occupy much less footprint area, thus providing small footprint and compact package structures. Also, connection of such inductor structures utilizes interconnects such as TIVs and/or connection patterns or metallization patterns of the redistribution layer to gain shorter interconnection, improved electrical performance and better layout flexibility. By doing so, the package structure integrated with complex 3D inductor structures provides small compact form factor and better power integrity for high performance power applications. In addition, flexible designs of the inductor structure can be used to support multi-phase voltage regulators, providing devices with high currents and low noises.

Figure 5A:
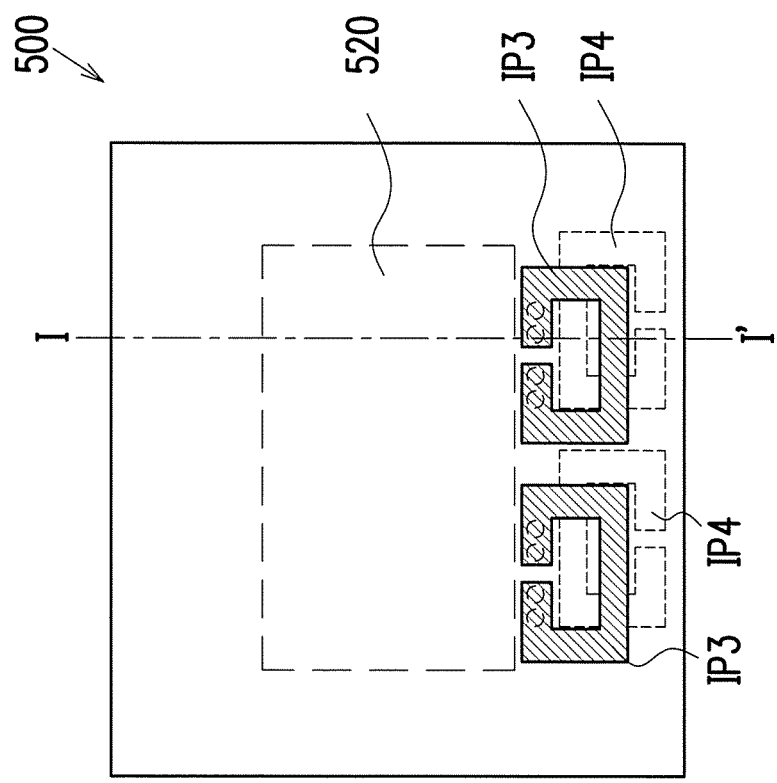
FIGS. 5A-5B are the schematic top and cross-sectional views showing a portion of a package structure according to some embodiments of the present disclosure.
Figure 5B:
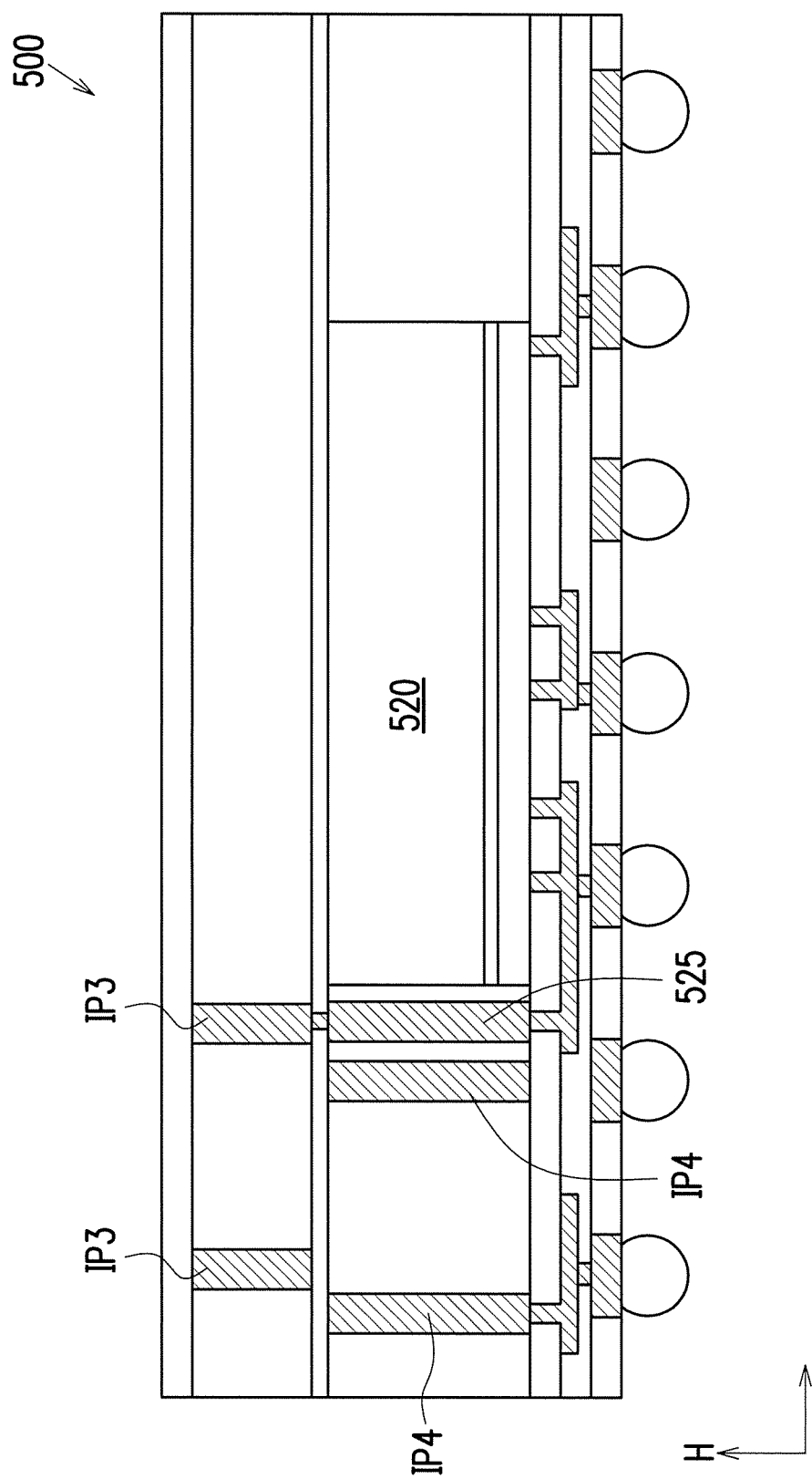

FIGS. 5A-5B are the schematic top and cross-sectional views showing a portion of a package structure 500 according to some embodiments of the present disclosure. FIG. 5B shows the schematic cross-sectional view of FIG. 5A along the cross-sectional line I-I'. In FIGS. 5A 5B, the inductor patterns IP3 are located above the chip 520 and the inductor pattern IP4 is located at the same level (same layer) with the chip 520. In some embodiments, the two inductor patterns IP3 are physically separate from each other, while the two inductor patterns IP4 are physically separate from each other. In some embodiments, the inductor patterns IP3 and the inductor patterns IP4 located at different layers are electrically coupled with one another and form coupled inductors. In some embodiments, the inductor patterns IP3, IP4 are horizontal inductor structures. The inductor patterns IP3 and IP4 are both located beside the chip 520 and along one side of the chip 520. In certain embodiments, the inductor pattern IP3 or IP4, similar to the inductor pattern 150 of FIG. 3A, is shaped as a planar split square ring. In certain embodiments, the inductor patterns IP3 or IP4 may be electrically connected with the chip 520 and the TIVs 525.

Figure 6A:
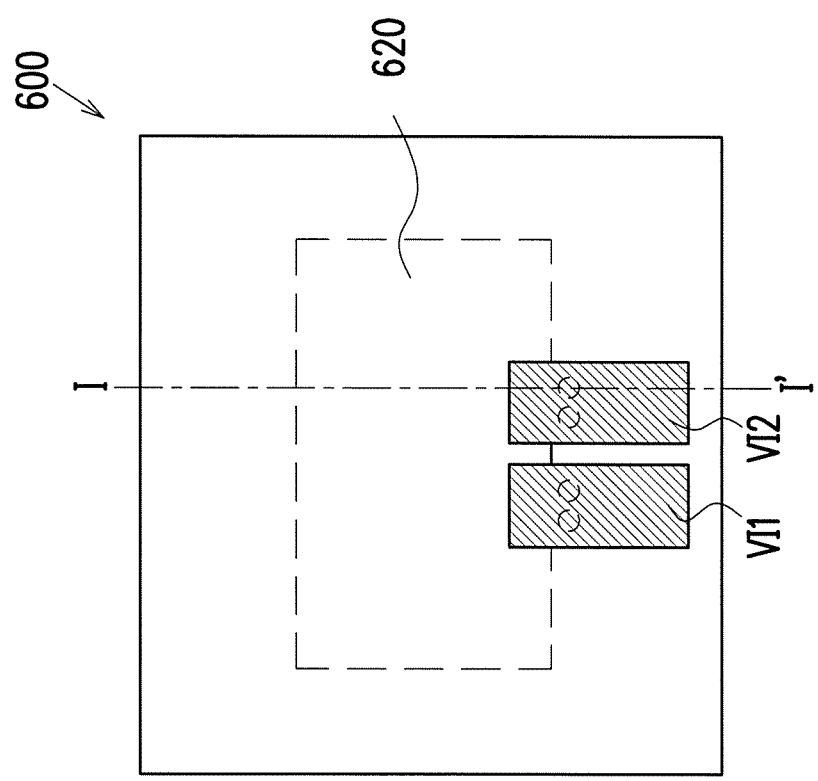
FIGS. 6A-6B are the schematic top and cross-sectional views showing a portion of a package structure according to some embodiments of the present disclosure.
Figure 6B:
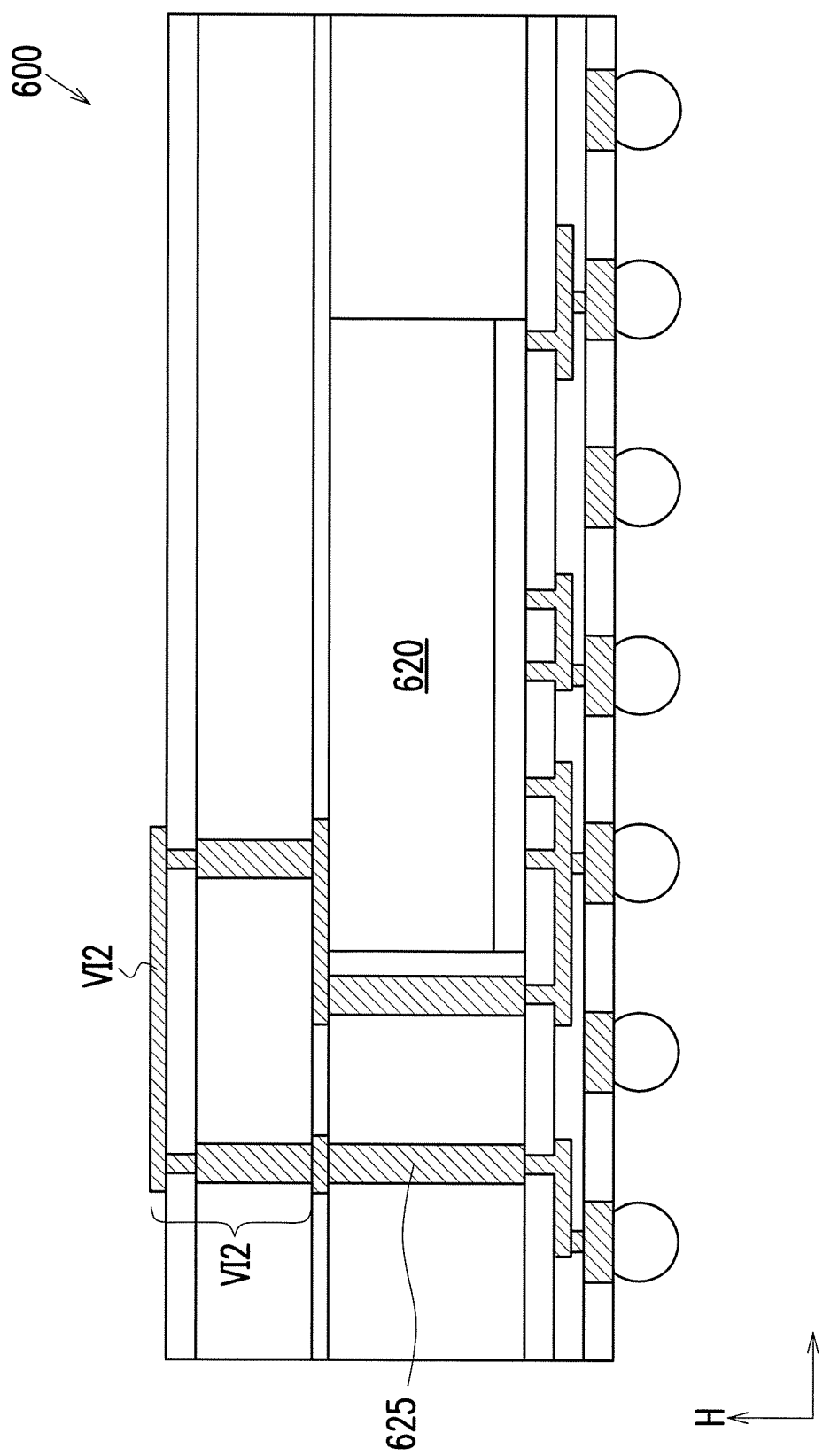

FIGS. 6A-6B are the schematic top and cross-sectional views showing a portion of a package structure 600 according to some embodiments of the present disclosure. FIG. 6B shows the schematic cross-sectional view of FIG. 6A along the cross-sectional line I-I'. In FIGS. 6A-6B, two vertical inductor structures VI1 and VI2 are located above the chip 620 and the vertical inductor structures VI1 and VI2 are located at the same level (the same layer). From the top view of In FIG. 6A, vertical projections (the shaded areas) of the two vertical inductor structures VI1 and VI2 are partially overlapped with a vertical projection of the chip 620 (shown as the area circled by the dotted line). In some embodiments, the vertical inductor structures VI1 and VI2 are arranged side by side and in parallel, and the vertical inductor structures VI1 and VI2 are physically separate from each other. In certain embodiments, the vertical inductor structure VI1 or VI2 in FIG. 6B, similar to the vertical inductor structure VI of FIG. 4B, has a ring shape at the vertical cross-section (e.g. along line I-I') along the thickness direction H of the package structure 600. In some embodiments, the vertical inductor structures VI1 and VI2 are located by one side of the chip 620 (partially within the span of the chip 620, as dotted line in FIG. 6A). In some embodiments, the vertical inductor structures VI1 and VI2 are electrically coupled with each other. In certain embodiments, the vertical inductor structure VI1 or VI2 may be electrically connected with the chip 620 and the TIVs 625.

In accordance with some embodiments in the present disclosure, the inductor structures can be located at multiple levels, including the same level of the chip or different levels from the chip level to form three-dimensional coupled inductors for multi-phase power circuit.

In some embodiments of the present disclosure, a package structure is provided. The package structure includes a chip encapsulated in a first molding compound and an inductor structure. The inductor structure is disposed above the chip and electrically connected to the chip. A vertical projection of the inductor structure at least partially overlaps with a vertical projection of the chip.

In some embodiments of the present disclosure, a package structure is provided. The package structure includes a chip, a first molding compound encapsulating the chip, first through interlayer vias (TIVs), a second molding compound, a first inductor structure and a second inductor structure. The first TIVs are disposed beside the chip and penetrating the first molding compound. The second molding compound is disposed on the first molding compound. The first inductor structure is disposed above the chip and is electrically connected to the chip through the first TIVs. The second inductor structure is disposed in the second molding compound and located above the chip. The second inductor structure is electrically connected to the chip through the first TIVs.

In some embodiments of the present disclosure, a method of fabricating a package structure is described. An inductor pattern and a connection pattern are formed over a carrier. First through interlayer vias (TIVs) and a metallization pattern are formed over the inductor pattern. A first molding compound is formed covering the first TIVs and the metallization pattern. Second TIVs are formed and a chip is provided on the first molding compound. A second molding compound is formed covering the second TIVs and the chip.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a chip laterally encapsulated in a first molding compound, wherein the first molding compound is an insulating molding compound wrapping around side surfaces of the chip;
   a second molding compound disposed on the first molding compound and on the chip;
   first through interlayer vias (TIVs) penetrating through the second molding compound;
   second through interlayer vias (TIVs) located beside the chip and penetrating only the first molding compound;
   a top dielectric layer disposed on top of and covering the second molding compound; and
   an inductor structure, disposed above the chip and electrically connected to the chip, wherein a vertical projection of the inductor structure at least partially overlaps with a vertical projection of the chip, wherein the inductor structure includes a first conductor structure having a first connection pattern disposed on the second molding compound and penetrating through the top dielectric layer, and a first inductor pattern connected to the first connection pattern and located above the first connection pattern and the second molding compound, wherein the first TIVs are in direct contact with the first connection pattern;

wherein the inductor structure includes a horizontal inductor in the second molding compound, the horizontal inductor has a first portion and a second portion connected with the first portion, the first portion is disposed above the chip and inside the vertical projection of the chip, and the second portion is disposed above the chip and outside the vertical projection of the chip.

2. The package structure according to claim 1, wherein the chip includes a power chip or a voltage regulating chip.

3. The package structure according to claim 1, further comprising:
   a dieletric layer located between the first and second molding compounds,
   wherein the first inductor pattern disposed on the top dielectric layer is exposed, and the first inductor structure is a vertical inductor structure.

4. The package structure according to claim 1, wherein the horizontal inductor structure is electrically and physically isolated from the first inductor structure by the second molding compound and the horizontal inductor structure is shaped as a split ring.

5. The package structure according to claim 4, wherein the second TIVs are connected to the second portion of the inductor structure.

6. The package structure according to claim 1, further comprising through interlayer vias (TIVs) penetrating the first molding compound and located beside the chip, wherein the TIVs are connected with the first TIVs.

7. The package structure according to claim 1, wherein the inductor structure comprises at least two vertical inductor structures arranged in parallel.

8. The package structure according to claim 1, wherein the inductor structure comprises at least two horizontal inductor structures arranged side by side and located above the first molding compound.

9. A package structure, comprising:
   a chip having an active surface and a backside opposite to the active surface, and side surfaces connecting the active surface and the backside;
   a first molding compound laterally encapsulating the side surfaces of the chip;
   first through interlayer vias (TIVs), disposed beside the chip, physically isolated from the chip by the first molding compound and penetrating the first molding co pound wherein the chip, the first TIVs, and the first molding compound have substantially a same height;
   a second molding compound disposed on the first molding compound and on the backside of the chip;
   a top dielectric layer disposed on top of the second molding compound;
   a first inductor structure, disposed above the chip and electrically connected to the chip through the first TIVs, wherein the first inductor structure is partially located in the second molding compound and partially protruded from the second molding compound, and a portion of the first inductor structure penetrates through the top dielectric layer and protrudes out of the top dielectric layer; and
   a second inductor structure, disposed in and embedded in the second molding compound and located above the chip, wherein the second inductor structure is physically separate from and electrically isolated from the first inductor structure by the second molding compound and the second inductor structure is electrically connected to the chip through the first TIVs.

10. The package structure according to claim 9, further comprising a third inductor structure disposed in the first molding compound.

11. The package structure according to claim 9, wherein the first inductor structure comprises:
   a connection pattern disposed on the second molding compound;
   an inductor pattern, disposed over the second molding compound and connected with the connection pattern; and
   second through interlayer vias (TIVs), disposed in the second molding compound and penetrating the second molding compound, wherein the inductor pattern, the connection pattern and the second TIVs form a vertical inductor structure.

12. The package structure according to claim 11, wherein a vertical projection of the first inductor structure at least partially overlaps with a vertical projection of the chip, and the inductor pattern is located outside of the second molding compound.

13. The package structure according to claim 9, wherein the second inductor structure comprises a horizontal inductor structure shaped as a split ring.

14. The package structure according to claim 13, wherein the second inductor structure includes a first portion disposed directly above the chip and a second portion disposed beside the chip, and the first TIVs are connected to the second portion of the inductor structure.

15. The package structure according to claim 1, further comprising a redistribution layer disposed below the chip and the first molding compound.

16. The package structure according to claim 15, wherein the redistribution layer includes an under bump metal (UBM) layer.

17. The package structure according to claim 16, further comprising solder balls mounted on the UBM layer.

18. The package structure according to claim 9, further comprising a redistribution layer disposed on the active surface of the chip and on the first molding compound.

19. The package structure according to claim 18, wherein the redistribution layer includes an under bump metal (UBM) layer.

20. The package structure according to claim 19, further comprising solder balls mounted on the UBM layer.

* * * * *